(12) United States Patent
Groenewold et al.

(10) Patent No.: US 6,486,674 B2
(45) Date of Patent: Nov. 26, 2002

(54) METHOD FOR DETECTING FAULTS ON SAFETY ORIENTED SENSORS

(75) Inventors: Heiko Groenewold, Detmold (DE); Ronald Hauf, Moehrendorf (DE)

(73) Assignee: Siemens Aktiengesellschaft (DE)

( * ) Notice: Subject to any disclaimer, the term of this patent is extended or adjusted under 35 U.S.C. 154(b) by 0 days.

(21) Appl. No.: 09/774,161

(22) Filed: Jan. 29, 2001

(65) Prior Publication Data

US 2001/0024125 A1 Sep. 27, 2001

(30) Foreign Application Priority Data

Jan. 27, 2000 (DE) .......................................... 100 03 519
Jul. 7, 2000 (DE) .......................................... 100 33 073

(51) Int. Cl.$^7$ ............................................. G01R 31/02
(52) U.S. Cl. ...................................... 324/423; 324/418
(58) Field of Search .................................. 324/535, 532, 324/423, 418, 420, 422, 421, 424

(56) References Cited

U.S. PATENT DOCUMENTS 5,243,291 A * 9/1993 Umemura .................... 324/418
6,188,225 B1 * 2/2001 Tislaric ....................... 324/422

* cited by examiner

Primary Examiner—N. Le
Assistant Examiner—J. Kerveros
(74) Attorney, Agent, or Firm—Baker Botts LLP

(57) ABSTRACT

A method for fault detection in the operation of sensors with at least two decoupled signal-transmitting elements with contacts and with a closed conductor loop includes delaying, a first test output by a defined switching delay with reespect to a second test output and evaluating the input channels in accordance with a defined expectation. Faults being inferred from deviations between actual and expected signal variations and time intervals.

5 Claims, 4 Drawing Sheets

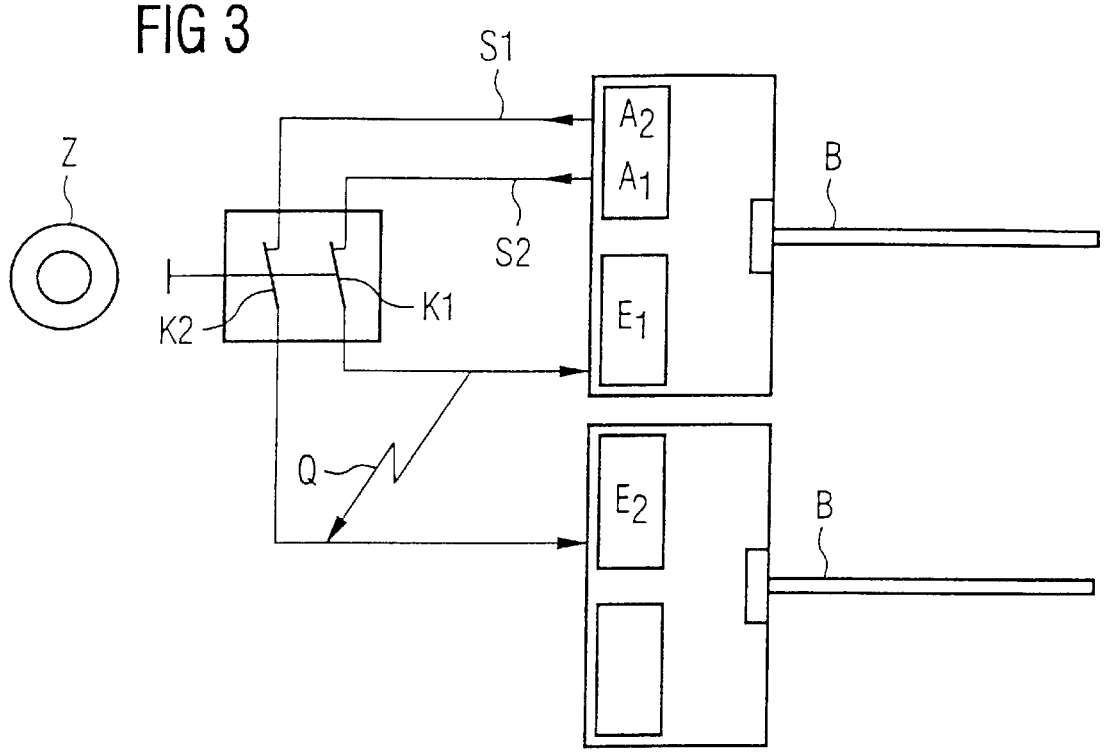
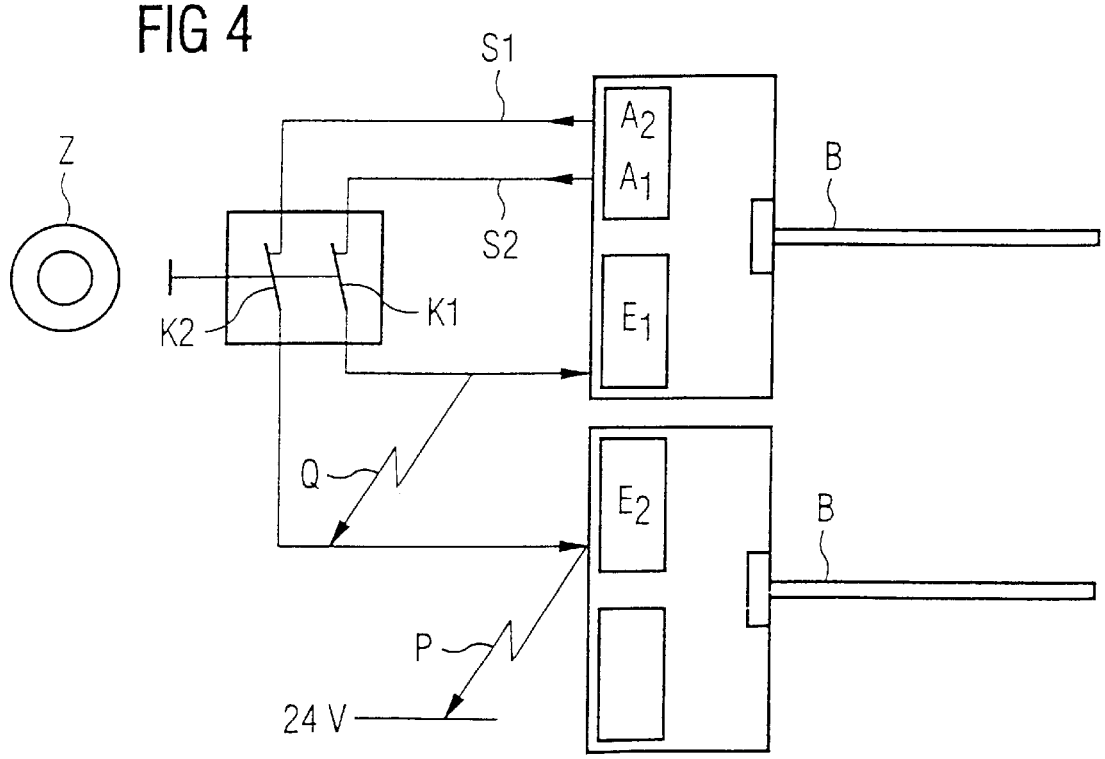

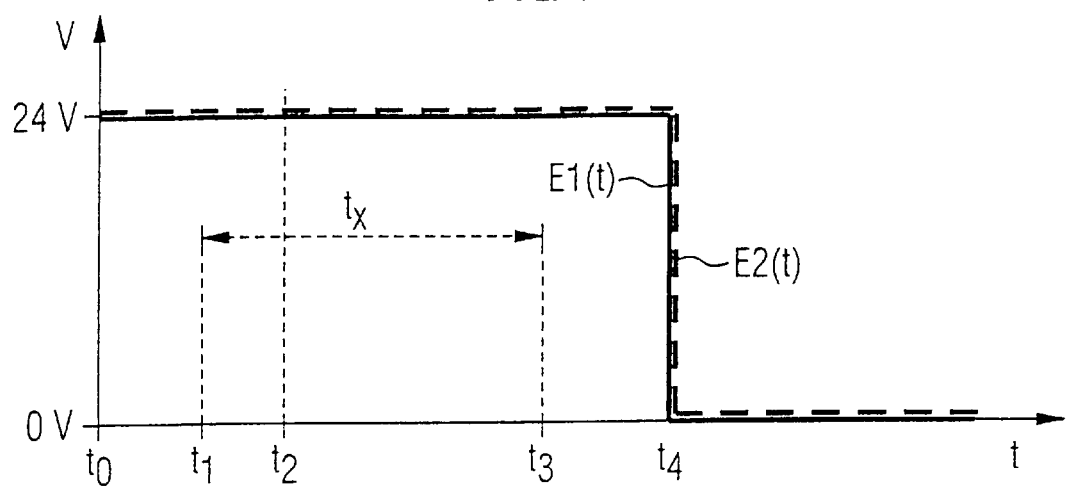
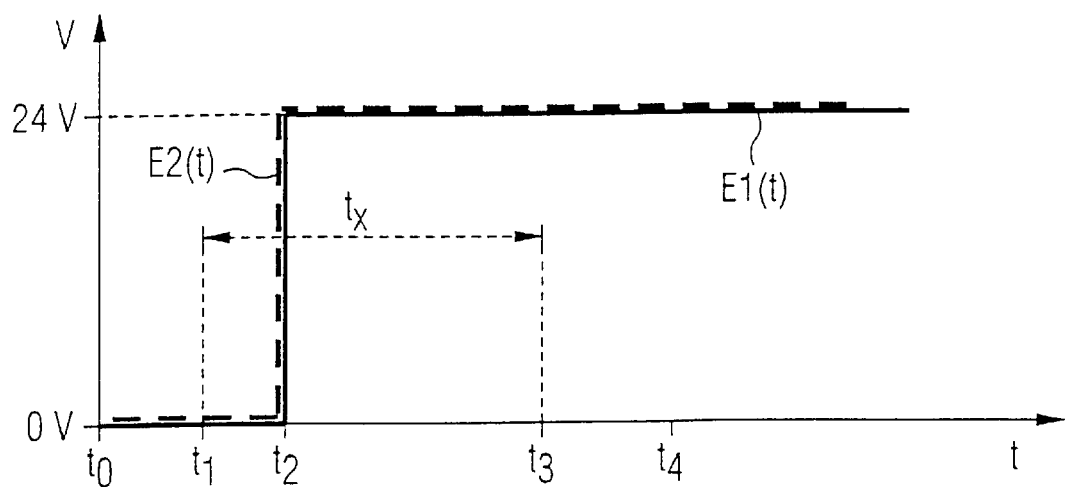

METHOD FOR DETECTING FAULTS ON SAFETY ORIENTED SENSORS

FIELD OF THE INVENTION

The present invention relates to a method for detecting faults in the operation of sensors and more particularly relates to such a method for detection faults in sensors with at least two decoupled signal-transmitting elements with contacts and with a closed conductor loop, in which a respective signal is applied to the input of each signal-transmitting element via an associated test output, which signal is supplied to an associated input channel at the output end.

BACKGROUND OF THE INVENTION

In processes in safety engineering, for example in applications such as emergency-stop buttons or door switches for protective door interlocking, industrial robots or numerically controlled machine tools, sensors, among other things, must be included and monitored to insure safety. To guarantee correct operation, faults on the sensor connecting lines must be detected rapidly. If the connecting lines are protected in the control cabinet or in system parts, it can be assumed, as a rule, that a fault (short circuit, short between wires etc.) is highly improbable. A standard (prEN 954-2) allows a so-called fault exclusion to be assumed for the connecting line in this case.

Normally, sensors are connected to a safety control system mainly in accordance with either a 3-terminal concept or a 4-terminal concept. In the case of the assumption of a fault exclusion, a sensor design according to the 3-terminal concept is completely adequate. If this cannot be guaranteed throughout or if higher requirements are set, as in the case of an emergency-stop button, the sensor must be connected in accordance with the 4-terminal concept.

A concept for reliable fault detection of short circuits and cross-connections on the connecting lines must be appropriately designed. The present invention describes a method by which this can be guaranteed in a relatively simple and economic manner.

According to the known prior art, there are the above-mentioned fundamental two possibilities of the 3-terminal concept and the 4-terminal concept for the safety-oriented actuation of a sensor. Both concepts will be explained in greater detail in the text which follows, with reference to the basic sketches shown in FIGS. 1 to 4.

The illustration of FIG. 1 shows a sensor connection according to the 3-terminal concept. In principle, all safety-oriented sensors have two decoupled signal-transmitting elements, shown as contacts K1 and K2 in a sensor Z (an emergency-stop button) in FIG. 1. These can be located in a single component (e.g. in the emergency-stop button) or in two physically separate components as is possible, for instance, in door switches for a protective door interlock.

The sensor Z is activated with a signal S1, which is conducted to the two contacts K1 and K2, via a common connection W from a test output A1, which can be provided, for example from a PLC (Programmable Logic Controller) with 24 V signal voltage. The two signals of the sensor Z are conducted to two input channels E1 and E2 of a safety-oriented control system (not shown). These signals are forwarded to a central control unit, such as via a system bus B, for further signal processing.

As already mentioned, safety components with contacts, e.g. emergency-stop buttons or standard components with contacts such as door switches for protective door interlocking, etc., can be used as a sensor if the two contacts are decoupled without mechanical interaction.

Faults in the connecting lines can be detected in conjunction with a cross-comparison of data and positive dynamization known to the expert. However, the 3-terminal concept cannot be used for detecting a pure cross-connection between the two inputs E1 and E2.

In the representation according to FIG. 2, a sensor connection employing the 4-terminal concept is shown. For this purpose, the sensor is activated by two test outputs A1 and A2 via separate signals S1 and S2, instead of via a common connection. The two signals of the sensor Z are connected to the two input channels E1 and E2 of the safety-oriented control system. For the rest, the illustration corresponds to that of FIG. 1.

A large proportion of the possible faults can already be detected with the 3-terminal concept in conjunction with the channel monitoring (cross-comparison of data) of the safety-oriented control system and a positive dynamization. For example:

a line break in the lines, for instance, can be detected directly via a cross-comparison of data;

a short circuit or cross-connection to P potential (P stands for a positive or negative voltage) can be detected within the test cycle with the aid of positive dynamization;

a short circuit to M potential (M stands for ground potential) can be detected directly via a fuse;

a cross-connection to P potential can be detected within the test cycle with the aid of positive dynamization; and a cross-connection to M potential can be detected directly via a fuse.

However, the 3-terminal arrangement does have short comings. For example, a cross-connection between the input channels E1 and E2 cannot be detected. A cross-connection between input channel E1 and E2 produces a so-called "sleeping fault" in the system. In the illustration of FIG. 3, a cross-connection Q between the signal lines to E1 and E2 is additionally indicated in a development of the illustration of FIG. 2.

A second fault, for example a P short as—shown in FIG. 4 can also cause the safety function to fail. For a control category 3, this is still acceptable if the fault detection can be guaranteed within the test cycle established for this part of the safety-oriented functions (e.g., 8 hours).

Normally, for example, the emergency-stop button or the protective door interlocking switch is connected via an external safety switching device. In these devices, the monitoring of the connecting lines is integrated and includes cross-connection monitoring. There is a further possibility if the sensors are connected to a safety PLC. However, this requires special peripheral assemblies in which the short-circuit and cross-connection monitoring is also integrated. There is no solution at present which manages such faults with only standard assemblies.

The protection against short circuits and cross-connections is also conceivable with special arrangement and design of the connecting lines to the sensor. In such an arrangement, the lines must be individually shielded and the shield must be connected via a fuse in order to detect a short before it leads to failure of the protective function. In general, however, such a solution fails in practice due to a lack of acceptance.

Although the known external safety switching devices mentioned meet the requirements with respect to monitoring of the sensor connecting line, they can only switch off power and do not reliably stop a machine. This is also the reason why these devices are being replaced more and more by integrated safety concepts, especially in the case of industrial robots and machine tools. Thus, they do not represent a forward-looking alternative to the present invention.

It is true that, from a purely technical point of view, the problem can also be solved by using a safety PLC. A safety PLC can activate a sensor up to control category 4 (according to EN 954-1). The electronics in the input modules probe the line by so-called light/dark switching. In this process, the outputs are disconnected for a few milliseconds and a measurement is taken in this interval. In this way, short circuits and cross-connections are detected immediately and in parallel with the running process in a high-quality manner. However, this solution cannot be implemented by way of standard input/output modules. Thus, for cost reasons, the safety PLCs are not generally used today in machine tools or production machines. Today, this approach is only used in very large systems having very many (>40) safety-oriented signals and/or if a design in control category 4 is required at the same time.

Another conventional method for fault detection in safety-oriented signals is an alternating channel-related activation (cycling) of the sensor. Channel E1 and channel E2 are each alternately activated only once. However, this must not lead to the signal chain being switched off at any time. A check is made whether there is any crosstalk to the channel which is not activated. During this time, any cross-comparison of data implemented must be switched off. This results in increased risk. Further, although this makes it possible to achieve the objective, in principle, the expenditure in the peripherals is no less. However, the interactions with the cross-comparison of data are considerable.

Another conventional method for fault detection in safety-oriented signals is performed by way of different channel-related polarities of the voltage. In this solution, the conductor loops of the two contacts E1 and E2 are fed with voltages of different polarity, e.g. channel E1 with +24 V and channel E2 with −24 V. However, a special power supply must be provided for this purpose. Such a bipolar supply, however, is not provided as standard in many systems and this further increases the wiring complexity.

OBJECTS AND SUMMARY OF THE INVENTION

It is, therefore, the object of the present invention to create a method for fault detection in safety-oriented signals which is also capable of detecting so-called "sleeping faults" and which can be implemented with relatively inexpensive standard elements and components.

In particular, it is intended to achieve, in contrast to the 3-terminal concept, a cross-connection detection between the two channels E1 and E2 in conjunction with positive dynamization.

According to the present invention, this object is achieved by a method for fault detection in the operation of sensors with at least two decoupled signal-transmitting elements with contacts and with a closed conductor loop, in which method a respective signal is applied to the input of each signal-transmitting element via an associated test output, which signal is supplied to an associated input channel at the output end. Preferably, each test output is switched at a defined time delay compared with the other test outputs, in such a manner that the respective signals are present at the respective signal-transmitting elements with a corresponding switching delay and the respective input channels follow a defined sequence of signal changes with a fixed temporal correlation. Further, it is also preferable that the input channels are evaluated on the basis of these signal variations and the respective time interval corresponding to a defined expectation, with the presence of faults being inferred from deviations between actual and expected signal variations and/or time intervals.

In a first embodiment of the present invention, the object set forth above is achieved, primarily in the operation of sensors with a predominantly static signal, in that the method is performed during a positive dynamization.

According to a further embodiment of the present invention, the method is performed when each sensor is switched on.

In yet another embodiment of the present invention, the method is performed when each sensor is switched off.

To detect a cross-connection in the operation of sensors with two decoupled signal-transmitting elements with contacts and with a closed conductor loop, both test outputs being activated at a starting time, the following further method steps are performed in accordance with a further embodiment of the present invention Deactivating a first test output at a first time; and
Generating a fault signal of the 'cross-connection' category if the signal of the input channel associated with the first test output remains in the activated signal state.

To detect a pure cross-connection without phase short, the following further method steps are performed in accordance with yet a further embodiment of the present invention, namely, waiting for a defined switching delay, deactivating the second test output at a time after the switching delay has expired, and generating a fault signal of the 'cross-connection without phase short' category if the signals of the two input channels together assume the deactivated signal state only after the switching delay for the second test output has expired.

To detect a cross-connection in the operation of sensors with two decoupled signal-transmitting elements with contacts and with a closed conductor loop, both test outputs being deactivated at a starting time, the method can also include the steps of activating a first test output at a first time, waiting for a defined switching delay, and generating a fault signal of the 'cross-connection' category if the signals of the two input channels assume the activated signal state and also remain active after the switching delay has expired.

According to a further embodiment of the method described above, a cross-comparison of data is additionally performed between the signals of the two input channels for detecting a line break in a signal line.

The concept according to the invention presented can be applied when sensors with contacts and with closed conductor loops (closed-circuit principle) are used. In the case of electronic signals, the line monitoring by the sensor must be ensured. This is also the case with higher-quality sensors, such as light curtains and scanners. Using the method of the present invention, it is now possible to implement complete fault detection (including cross-connection) on the sensor connecting lines using standard modules.

The sensor is generally connected using the 4-terminal concept. As a result, no additional wiring is required and no special modules with integrated safety-oriented functions must be used. Apart from the time-delayed switching of the test outputs, the type of evaluation of the input channels is also significant. The evaluation performed with defined expectation is based on signal variation and/or time interval.

Further details and advantages of the present invention will become apparent from the description of preferred embodiments in conjunction with the figures, in which features having the same functionality are designated by the same reference symbols for the sake of better clarity.

BRIEF DESCRIPTION OF THE DRAWINGS

FIG. 3 is a schematic diagram shows a cross-connection in the sensor connecting line.

FIG. 4 is a schematic diagram that shows a cross-connection and P short in the sensor connecting line.

FIG. 6 is a timing diagram that shows a signal variation without fault on switch-on.

FIG. 7 is a timing diagram that shows a signal variation with cross-connection on switch-off.

FIG. 8 is a timing diagram that shows a signal variation with cross-connection on switch-on.

DETAILED DESCRIPTION OF PREFERRED EMBODIMENTS

The illustrations of FIGS. 1 to 4 have already been described in detail in the context of the introduction to the description for illustrating problems and for representing the starting point of the invention and the known prior art. The associated reference symbols have already been introduced so that they can be used as a basis in the text which follows. The present invention will be described in connection with the circuit structure shown in FIG. 4.

The concept of the present invention is based on the fact that test output A1 is switched delayed by a defined time $t_x$ compared with the test output A2. The test can be performed both when switching the sensor or an associated system on or off and during a positive dynamization. For example, the defined switch-off of the test outputs during a positive dynamization produces an unambiguous expectation at the input channels E1 and E2. The input channels E1 and E2 follow a defined sequence of signal changes associated with a fixed time correlation. This expectation can be evaluated in a single-channel manner in a downstream PLC or corresponding hardware (e.g. an application-specific integrated circuit or ASIC) for control category 3 (according to the standard EN 954-1) since this is the test routine of the two-channel sensor connection. This makes it possible to economically detect all short circuits, cross-connections and line breaks in the signal lines.

Figure 1:
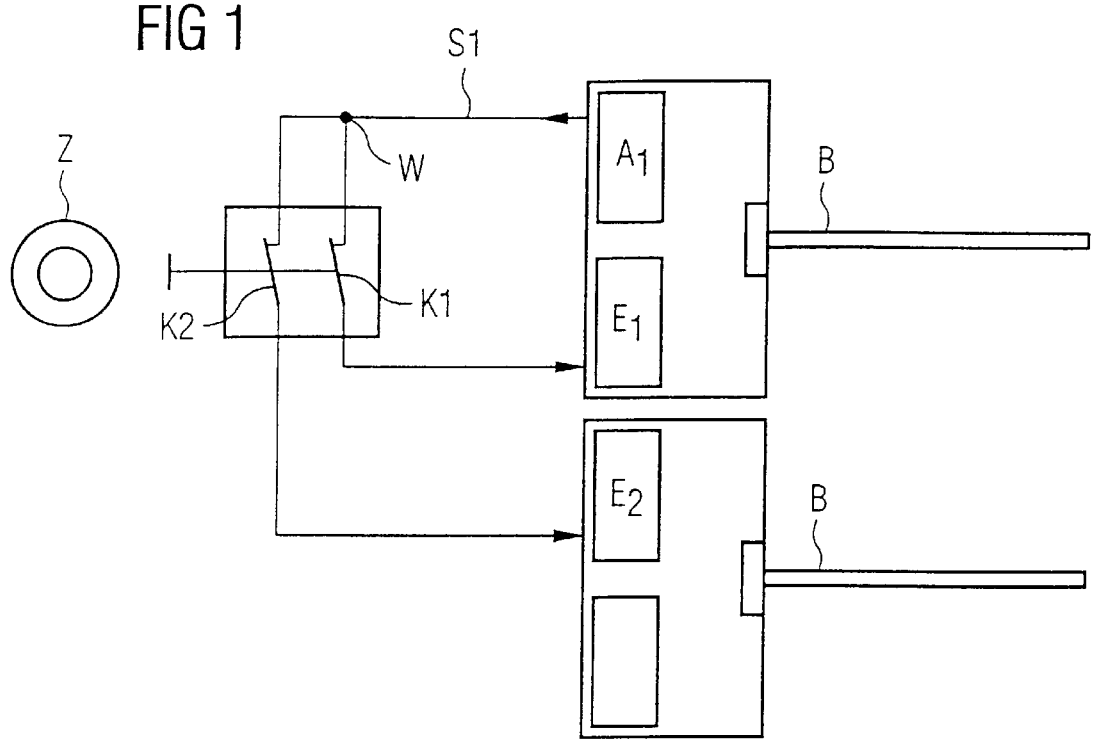
FIG. 1 is a schematic diagram that shows the sensor connection with 3-terminal concept (e.g. for emergency stop).
Figure 2:
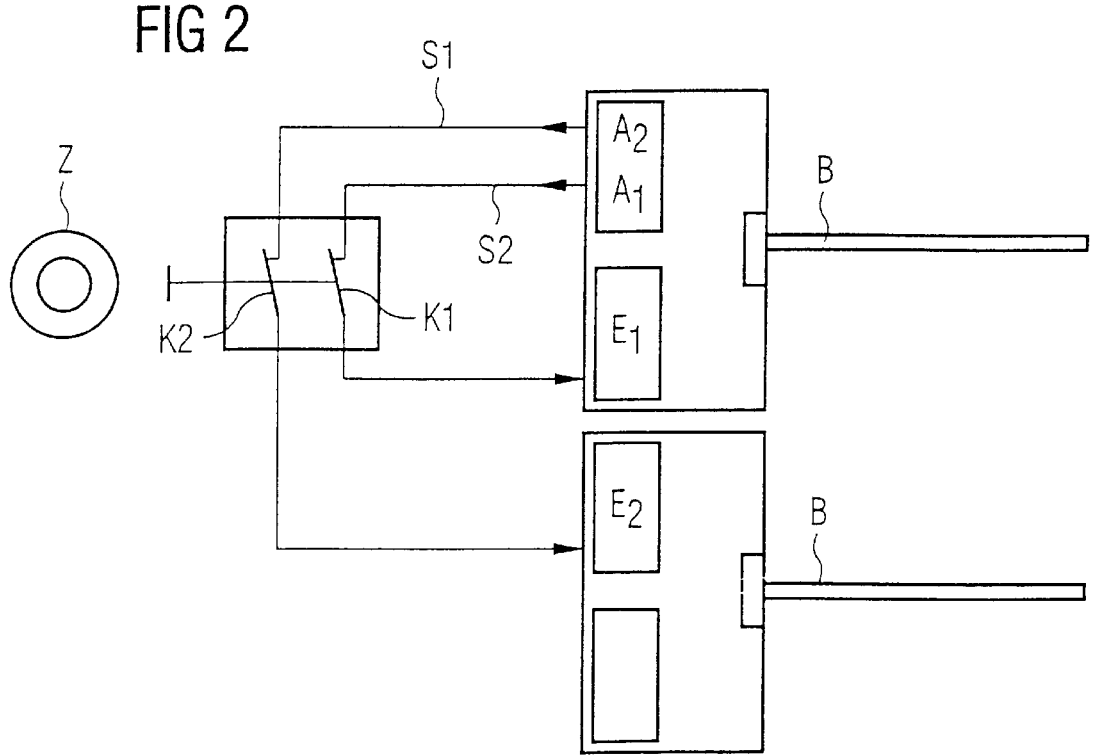
FIG. 2 is a schematic diagram that shows the sensor connection with 4-terminal concept (e.g. for emergency stop).
Figure 5:
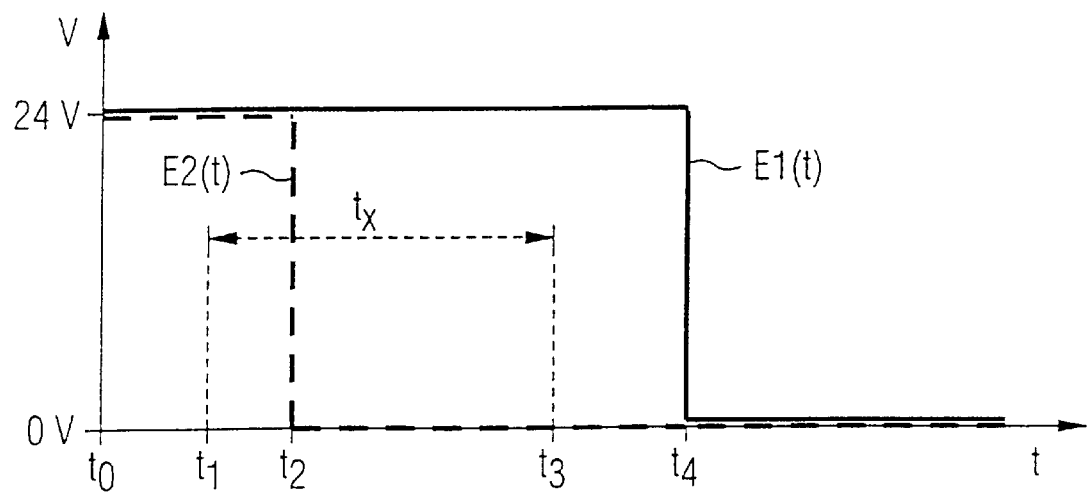
FIG. 5 is a timing diagram that shows a signal variation without fault on switch-off.

In the text which follows, the functional sequence of a test routine according to the present invention with positive dynamization during switch-off will be shown for the 'no fault' case. The illustration of FIG. 5 shows the associated signal variation without fault on switch-off. Along the vertical axis, a voltage (for example 24 volts) is plotted and along the horizontal axis the time is plotted with times T0 to t4 which will be explained in greater detail in the text which follows. The signal variation E1(t) for channel 1 is entered by a continuous line while the signal variation E2(t) for channel 2 is entered in the form of a dotted line in the coordinate system. The switching state "on" or "1" generally corresponds to a positive voltage signal, such as 24 V, whereas the switching state "off" or "0" corresponds to 0 volts, that is to say it is located on the horizontal axis. This also applies to the illustrations of FIGS. 6 to 8.

For the case of a signal variation without fault on switch-off, the expectation is that defined signals are present at input channels E1 and E2 at certain times and that the switching delay corresponds to the time $t_x$.

The following timing marks are shown:

| | |
|---|---|
| t0 = | Test outputs A1 and A2 are "on" |
| t1 = | Test output A2 is switched to "off" |
| tx = | Test output A1 switching delay |
| t2 = | Input channel E2 - signal E2(t) goes to "0" |
| t3 = | Test output A1 is switched to "off" |
| t4 = | Input channel E1 - signal E1(t) goes to "0" |

The following expectations are allocated to the timing marks listed.

Time t0:
Both test outputs A1 and A2 are switched to "on".
Expectation: Signals E1(t) and E2(t) of the input channels E1 and E2 are at "1".

Time t1:
The test output A2 is switched "off", switching delay tx is running.
Expectation: Signals E1(t) and E2(t) of the input channels E1 and E2 are at "1".

Time tx:
The switching delay time tx provides a reproducible reference for the signal comparison.

Time t2:
The input channel E2-signal E2(t) goes to "0".
Expectation: Signal E1(t) of the input channel E1 stays at "1".

Time t3:
The test output A1 is switched "off" after the switching delay tx has expired.
Expectation: Signal E1(t) of the input channel E1 remains at "1".

Time t4:
The input channel E1-signal E1(t) goes to "0".
Expectation: Signals E1(t) and E2(t) of the input channels E1 and E2 are at "0".

In the further text, the functional sequence of a test routine according to the present invention, with positive dynamization switch-on, is shown for the 'no fault' case.

Figure 6:
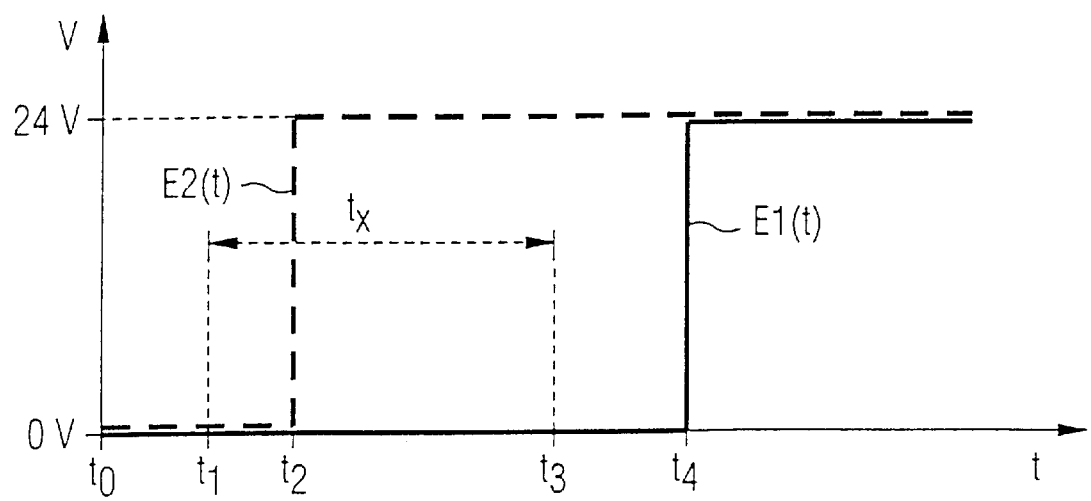

The illustration of FIG. 6 shows the associated signal variation without fault on switch-on. The expectation is again that defined signals E1(t) and E2(t) are present at certain times at input channels E1 and E2 and that the switching delay corresponds to time $t_x$.

The timing marks for this case are as follows:

| | |
|---|---|
| t0 = | Test outputs A1 and A2 are "off" |
| t1 = | Test output A2 is switched to "on" |
| tx = | Switching delay for test output A1 |
| t2 = | Input channel E2 - signal E2(t) goes to "1" |
| t3 = | Test output 1 is switched to "on" |
| t4 = | Input channel E1 - signal E1(t) goes to "1" |

The functional sequence of a test routine according to the present invention with positive dynamization on switch-off is now shown for the case of a cross-connection.

The illustration of FIG. 7 illustrates the associated signal variation when a cross-connection is present on switch-off. The expectation is that the typical signal variations E1(t), E2(t) will not appear at input channels E1 and E2 in the case of a fault with cross-connection.

For this case, the timing marks differ from those associated with FIG. 5, as follows:

Time t2:

Although test output A2 is switched off, the input channel 2 remains at signal state "1". Expectation is not met—there must be a cross-connection.

Time t4:

The two signals E1(t), E2(t) of the input channels E1 and E2 only assume the signal state "0" when the test output A1 is switched off. It follows from this that there must be a pure cross-connection without P short.

In contrast, the functional sequence of a test routine according to the present invention with positive dynamization on switch-on for the case of a cross-connection is as follows.

The illustration of FIG. 8 shows the associated signal variation when a cross-connection is present at switch-on. The expectation is that the typical signal levels E1(t), E2(t) at test inputs E1 and E2 do not appear and that the switching delay is not equal to the time $t_x$.

For this case, the timing marks differ from those associated with FIG. 6 as follows:

Time t2:

Although only test output A2 is switched on, both input channels E1, E2 assume the signal state "1". The switching delay $t_x$ is ineffective. The expectation is not met—there must be a pure cross-connection.

Accordingly, the following types of fault can be detected by the method according to the present invention in conjunction with known methods for fault detection:

- a line break in the lines, for instance, can be detected directly via a cross-comparison of data;
- a short circuit or cross-connection to P potential, where P stands for a positive or negative voltage, can be detected within the test cycle with the aid of positive dynamization;
- a short circuit to M potential, where M stands for ground potential, can be detected directly via a fuse;
- a cross-connection to P potential can be detected within the test cycle with the aid of positive dynamization;
- a cross-connection to M potential can be detected directly via a fuse; and
- a cross connection between input channels E1 and E2 can also be detected.

A cross-comparison of data together with a positive dynamization and the method according to the present invention provide for comprehensive fault detection on the sensor connecting lines. This makes it possible to meet the requirements of control category 3 according to Standard EN954-1.

Apart from other advantages described in the above statements, the following features of the invention, in particular, are found to be advantageous compared with the known prior art. It now becomes possible to use standard peripheral modules. The test routine described can also be implemented in single-channel manner in a PLC or hardware. With a predominantly static signal, the test routine can be initiated by positive dynamization. The positive dynamization is used for detecting the first fault during the time the second fault occurs. The wiring to the sensor is standard wiring. No special laying of the lines is required.

It is also now possible to offer an economic solution for safety-oriented sensors with a requirement for cross-connection protection. The costs for this are considerably below those of conventional solutions. In addition, a uniform comprehensive concept is produced in conjunction with the 4-terminal concept.

This concept according to the present invention can also be adopted for hardware-based systems such as, for example, the field of control and signaling devices for safety-oriented peripheral modules. The test routine can be integrated in ASICs. The invention can thus also be applied in decentralized autonomous systems.

What is claimed is:

1. A method for detecting faults in the operation of sensors having two jointly actuable, contacted, electrically uncoupled signal-emitting elements each of which has a closed conductor loop, and is impressed on an input side via of a test output with a respective DC voltage signal which is passed on the output side to an associated input channel comprising, delaying each test output by a defined time interval relative to other test outputs so that the DC voltage occurs with a corresponding switch delay at a signal-emitting element and the input channels follow a defined sequence of signal changes having a fixed time assignment; and evaluating the input channels on the basis of the signal changes and time interval according to a defined expectation, whereby conclusions are drawn from deviation of actual and expected signal changes and/or time intervals relating to the presence of errors; said method being carried out in the framework of a positive dynamization and/or upon switching on and/or switching off of each sensor.

2. The method for detecting faults in the operation of sensors as claimed in claim 1, further comprising deactivating a first test output at a first time; generating a fault signal of a 'cross-connection' category if the signal of the input channel associated with the first test output remains in the activated signal state after said deactivating of said first test output, whereby a cross-connection in the operation of sensors is detected.

3. The method for detecting faults in the operation of sensors as claimed in claim 2, further comprising:

waiting for a defined switching delay interval, deactivating the second test output at a time after the switching delay interval has expired;

generating a fault signal of a 'cross-connection without phase short' category if the signals of the two input channels together assume the deactivated signal state only after the switching delay interval for the second test output has expired, whereby cross-connection without a phase short is detected.

4. The method for detecting faults in the operation of sensors as claimed in claim 1, further comprising activating a first test output at a first time; waiting for a defined switching delay interval; generating a fault signal of a 'cross-connection' category if the signals of the two input channels assume the activated signal state and also remain active after the switching delay has expired, whereby cross-connection is detected.

5. The method for detecting faults in the operation of sensors as claimed claim 1, further comprising a cross-comparison of data performed between the signals of the two input channels for detecting a line break in a signal line.

* * * * *